United States Patent
Huang

(10) Patent No.: US 12,176,383 B2
(45) Date of Patent: Dec. 24, 2024

(54) DISPLAY DEVICE AND SPLICE DISPLAY DEVICE

(71) Applicant: TCL CHINA STAR OPTOELECTRONICS TECHNOLOGY CO., LTD., Guangdong (CN)

(72) Inventor: Guochuan Huang, Guangdong (CN)

(73) Assignee: TCL CHINA STAR OPTOELECTRONICS TECHNOLOGY CO., LTD., Guangdong (CN)

( * ) Notice: Subject to any disclaimer, the term of this patent is extended or adjusted under 35 U.S.C. 154(b) by 0 days.

(21) Appl. No.: 17/622,982

(22) PCT Filed: Dec. 20, 2021

(86) PCT No.: PCT/CN2021/139825
§ 371 (c)(1),
(2) Date: Dec. 27, 2021

(87) PCT Pub. No.: WO2023/108698
PCT Pub. Date: Jun. 22, 2023

(65) Prior Publication Data
US 2024/0072098 A1     Feb. 29, 2024

(30) Foreign Application Priority Data
Dec. 16, 2021   (CN) .......................... 202111547192.4

(51) Int. Cl.
*H01L 27/15*     (2006.01)
*H01L 33/58*     (2010.01)
*H05K 5/00*     (2006.01)

(52) U.S. Cl.
CPC ............ *H01L 27/156* (2013.01); *H01L 33/58* (2013.01); *H05K 5/0021* (2013.01)

(58) Field of Classification Search
CPC .............................. H01L 27/156; H01L 33/58
See application file for complete search history.

(56) References Cited

U.S. PATENT DOCUMENTS

2014/0218971 A1\*   8/2014   Wu ..................... F21V 33/0052
                                              362/613
2015/0055218 A1    2/2015   Yoo et al.
(Continued)

FOREIGN PATENT DOCUMENTS

CN    102067196 A    5/2011
CN    102257549 A    11/2011
(Continued)

OTHER PUBLICATIONS

International Search Report in International application No. PCT/CN2021/139825, mailed on Sep. 15, 2022.
(Continued)

*Primary Examiner* — Christine A Enad
(74) *Attorney, Agent, or Firm* — PV IP PC; Wei Te Chung

(57) ABSTRACT

A display device and a splice display device are provided by the present application. The display device of the present application includes a main-display region and a sub-display region surrounding the main-display region. The display device includes a display panel including a main-pixel region positioned in the main-display region and a sub-pixel region positioned in the sub-display region. An optical element disposed on the display panel and covering the sub-display region.

18 Claims, 5 Drawing Sheets

(56) References Cited

U.S. PATENT DOCUMENTS

2016/0327699 A1* 11/2016 Li ..................... G06F 3/1446
2021/0313410 A1* 10/2021 Kim ................... H10K 59/131

FOREIGN PATENT DOCUMENTS

| CN | 102262842 A | 11/2011 |
| CN | 103518233 A | 1/2014 |
| CN | 103971600 A | 8/2014 |
| CN | 104483780 A | 4/2015 |
| CN | 104503115 A | 4/2015 |
| CN | 105304642 A | 2/2016 |
| CN | 106097902 A | 11/2016 |
| CN | 108335636 A | 7/2018 |
| CN | 110824786 A | 2/2020 |
| CN | 110989069 A | 4/2020 |
| CN | 111312085 A | 6/2020 |
| CN | 113471257 A | 10/2021 |
| CN | 113571569 A | 10/2021 |
| CN | 113764462 A | 12/2021 |
| JP | 2004524551 A | 8/2004 |
| JP | 2015172661 A | 10/2015 |
| TW | 201140155 A | 11/2011 |
| WO | 2010140537 A1 | 12/2010 |

OTHER PUBLICATIONS

Written Opinion of the International Search Authority in International application No. PCT/CN2021/139825, mailed on Sep. 15, 2022.
Chinese Office Action issued in corresponding Chinese Patent Application No. 202111547192.4 dated Jul. 22, 2022, pp. 1-10.
Chinese Office Action issued in corresponding Chinese Patent Application No. 202111547192.4 dated Dec. 30, 2022, pp. 1-11.
Chinese Decision of Rejection issued in corresponding Chinese Patent Application No. 202111547192.4 dated Mar. 8, 2023, pp. 1-8.
Japanese Office Action issued in corresponding Japanese Patent Application No. 特願2021-577108 dated Jan. 29, 2024, pp. 1-4.

* cited by examiner

DISPLAY DEVICE AND SPLICE DISPLAY DEVICE

FIELD OF INVENTION

The present application relates to display technologies, and more particularly, to a display device and a splice display device.

BACKGROUND OF INVENTION

A screen-to-body ratio is an important indicator of a display device, and an increase in the screen-to-body ratio can provide people an excellent visual experience and interactive effects. At present, in order to enhance a visual effect and make users feel more immersive, people are increasingly pursuing a larger screen-to-body ratio and narrow bezel design.

On a market side of high-end panel display devices (mobile phones, tablets, laptops, desktop displays, TVs, splicing screens, etc.), the narrower the frame of the display device, the better the display effect, the more high-end, the more consumers love it. The higher the price, and the higher the operating profit of the display device manufacturing plant.

The narrow-bezel display devices currently sold on the market mainly use side-gluing narrow-bezel technology. It only shortens a width of the border, and does not achieve true borderless.

As shown in FIG. 1, there are still splicing seams 300' that cannot display images when the current narrow-frame display device 100' is splice to form a splice display device 200'. An overall display effect of the splice display device 200' is not good, which is different from a display effect of an entire screen display device. It shows that there is a significant difference between the splice display device and the entire screen display device.

SUMMARY OF INVENTION

The embodiment of the present application provides a display device and a splice display device, which can solve the problems that the currently display device cannot achieve borderless display, and the current splice display device cannot display pictures at a seam of splicing.

In order to solve the above problems, the present application provides a display device, which includes a main-display region and a sub-display region surrounding the main-display region, wherein the display device includes:
  a display panel including a main-pixel region positioned in the main-display region and a sub-pixel region positioned in the sub-display region; and
  an optical element disposed on the display panel and covers the sub-display region;
  wherein the optical element is configured to amplify a light exit angle of the light emitted, reflected or transmitted by the display panel of the sub-display region.

Further, the optical element is a plano-convex lens, and wherein a side of a bottom surface close to the display panel of the optical element is a flat surface, and wherein a side of a top surface far away from the display panel of the optical element is a curved surface.

Further, the optical element further includes two terminal surfaces vertically connected between the bottom surface and the top surface;
  wherein on a cross-section parallel to the terminal surface of the optical element, the optical element amplifies the light exit angle of the light emitted, reflected or transmitted by the display panel of the sub-display region.

Further, the sub-display region includes:
  two first sub-display regions parallel to each other, wherein the first sub-display regions extend along a first direction;
  the display panel including:
  a plurality of main-pixel units positioned in the main-pixel region;
  a plurality of first sub-pixel units positioned in at least one of the first sub-display regions;
  the optical element including:
  a first optical element covers the first sub-display region, wherein a terminal surface of the first optical element is perpendicular to the first direction.

Further, a length of the first sub-pixel unit in the first direction is the same as a length of the main-pixel unit in the first direction, and wherein a length of the first sub-pixel unit in the second direction perpendicular to the first direction is shorter than a length of the main-pixel unit in the second direction.

Further, the sub-display region further includes:
  two second sub-display regions parallel to each other, wherein the sub-display regions extending in a second direction perpendicular to the first direction;
  the display panel further including:
  a plurality of second sub-pixel units positioned in at least one of the second sub-display regions;
  the optical element further including:
  a second optical element covers at least one of the second sub-display region, wherein a terminal surface of the second optical element perpendicular to the second direction.

Further, a length of the second sub-pixel unit in the second direction is the same as a length of the main-pixel unit in the second direction, and wherein a length of the second sub-pixel unit in the first direction is shorter than a length of the main-pixel unit in the first direction.

Further, t the two second sub-display regions are both disposed between the two first sub-display regions; or
  both of the two first sub-display regions are disposed between both of the two second sub-display regions.

Further, the display panel further includes:
  a wiring region disposed between the main-pixel region and the sub-pixel region, and is positioned in the sub-display region;
  a sealant region disposed on a side of the sub-pixel region away from the main-pixel region and positioned in the sub-display region; and
  a side adhesive region disposed on a side of the sealant region away from the sub-pixel region and positioned in the sub-display region;
  wherein the optical element completely covers the wiring region, the sub-pixel region, the sealant region, and the side adhesive region.

Further, the display device further includes a backlight source disposed on a side of the display panel away from the optical element and positioned in the main-display region and the sub-display region; and
  a fixing glue fixed between the display panel and the backlight;
  wherein, a brightness of the backlight source corresponding to the sub-pixel region is greater than a brightness of the backlight source corresponding to the main-pixel region.

In order to solve the above-mentioned problems, the present application provides a splice display device, which includes a plurality of mutually splice display devices related to the present application.

By setting the sub-pixel region in the sub-display region (the frame region not displayed in the prior art) on a periphery of the main display region, and by disposing the optical element on the sub-pixel region. The optical element is configured to amplify the light exit angle of the light emitted, reflected or transmitted by the display panel of the sub-display region. A frame region becomes the sub-display region with the same display effect as the main display region, thereby realizing a true borderless display effect. By splicing the display device of the present application to form a splice display device, the problem that a seam of splicing cannot be displayed in the prior art can be solved. The display effect of the splice display device can be improved, and the product competitiveness and operating profit of the splice display device can be improved.

DESCRIPTION OF FIGURES

In order to explain the technical solutions in the embodiments of the present application more clearly, the following will briefly introduce the figures needed in the description of the embodiments. Obviously, the figures in the following description are only some embodiments of the present application. For those skilled in the art, without inventive steps, other figures can be obtained based on these figures.

DETAILED DESCRIPTION OF EMBODIMENTS

Hereinafter, the preferred embodiments of the present application will be described in detail with reference to the accompanying figures of the specification, so as to fully introduce the technical content of the present application to those skilled in the art, to demonstrate the present application can be implemented by examples, to make the technical content disclosed by the present application becomes clearer and makes the present application clearer. It is easier for those skilled in the art to understand how to implement the present application. However, the present application can be embodied in many different forms of embodiments, and a protection scope of the present application is not limited to the embodiments mentioned in the text, and the description of the following embodiments is not intended to limit a scope of the present application.

The direction terms mentioned in the present application, such as "up", "down", "front", "rear", "left", "right", "inner", "outer", "side", etc., are only attached directions in the figures and the directional terms used herein are used to explain and describe the present application, not to limit a protection scope of the present application.

In the figures, components with the same structure are denoted by the same numerals, and components with similar structures or functions are denoted by similar numerals. In addition, for ease of understanding and description, a size and a thickness of each component shown in the figures are arbitrarily shown, and the present application does not limit the size and thickness of each component.

Embodiment 1

Figure 1:
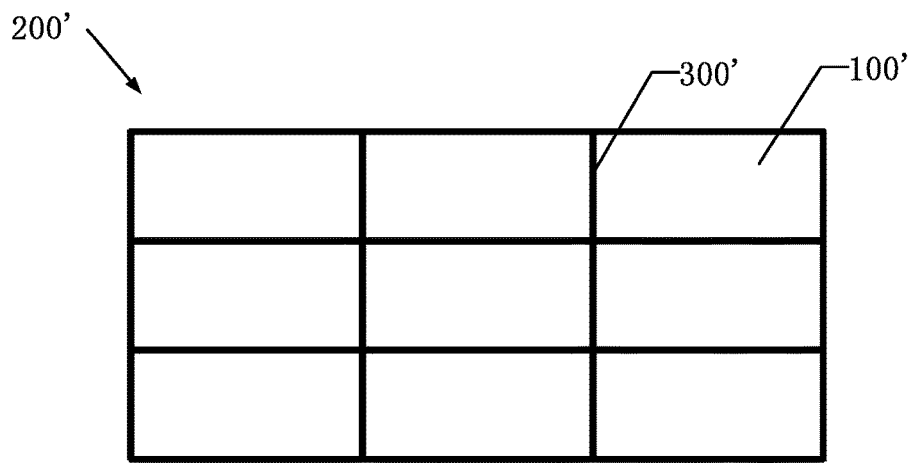
FIG. 1 is a schematic plan view of a conventional splice display device.
Figure 2:
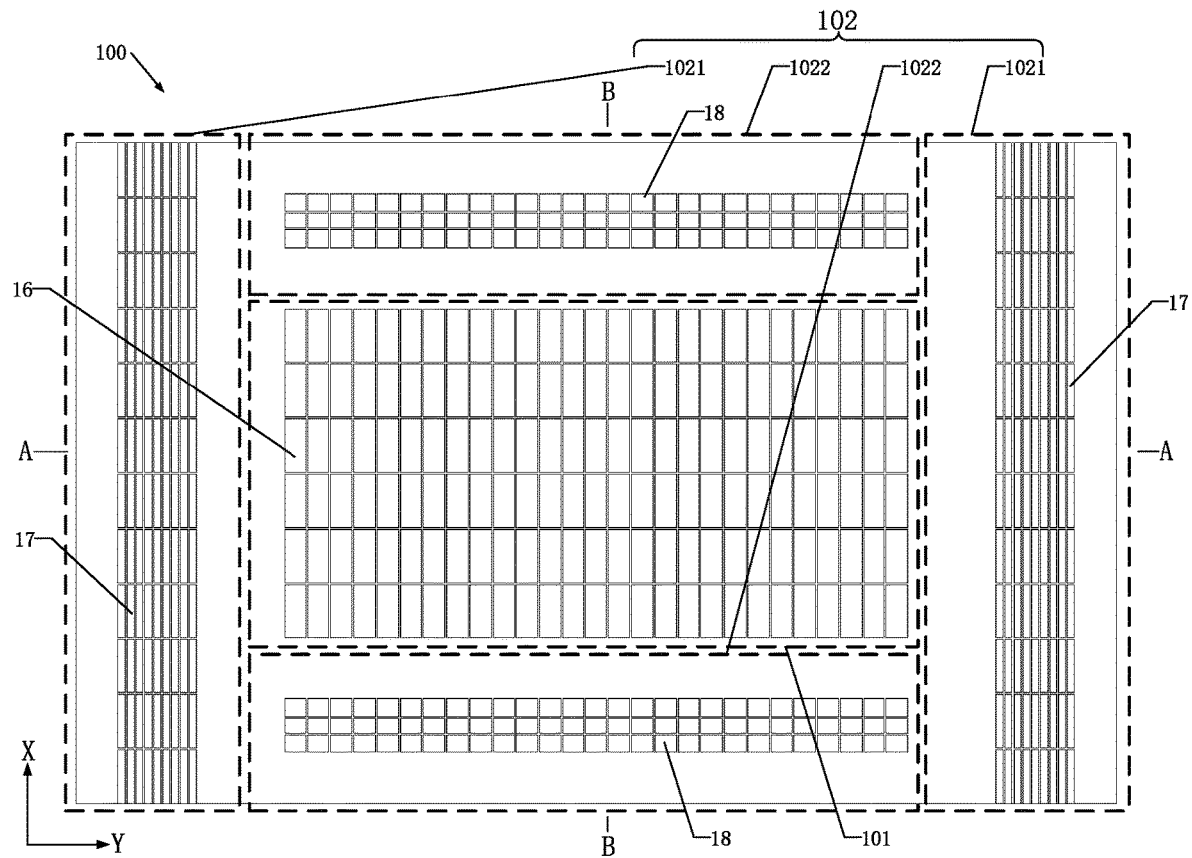
FIG. 2 is a schematic plan view of a display device according to a first embodiment of the present application.

As shown in FIG. 2, this embodiment provides a display device 100 which includes a main-display region 101 and a sub-display region 102 surrounding the main-display region 101.

Figure 3:
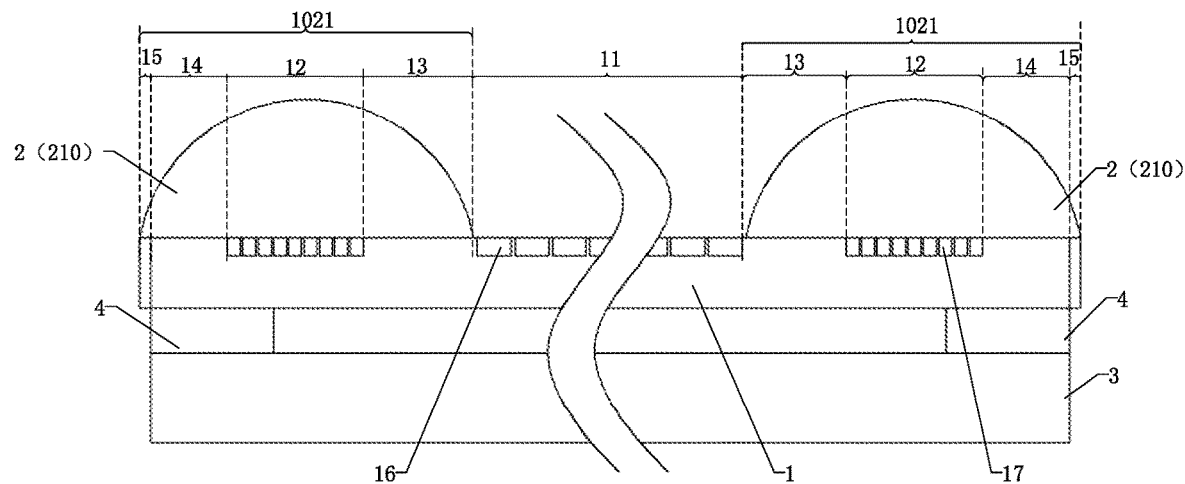
FIG. 3 is a cross-sectional view of A-A shown in FIG. 2.

As shown in FIG. 3, the display device 100 includes a display panel 1, an optical element 2, a backlight source 3, and a fixing glue 4.

As shown in FIG. 3, the display panel 1 includes a main-pixel region 11, a sub-pixel region 12, a wiring region 13, a sealant region 14, and a side adhesive region 15.

As shown in FIGS. 2 and 3, the main-pixel region 11 is positioned in the main-display region 101, and the sub-pixel region 12 is positioned in the sub-display regio 102.

As shown in FIGS. 2 and 3, the wiring region 13 is disposed between the main-pixel region 11 and the sub-pixel region 12 and is positioned in the sub-display region 102. That is, the wiring region 13 surrounds the main-pixel region 11, and the sub-pixel region 12 surrounds the wiring region 13. The wiring region 13 is mainly configured to place the wiring of the display panel 1.

As shown in FIGS. 2 and 3, the sealant region 14 is disposed on a side of the sub-pixel region 12 away from the main-pixel region 11 and is positioned in the sub-display region 102. That is, the sealant region 14 surrounds the sub-pixel region 12. The sealant region 14 is mainly configured to place sealant in the display panel 1, and the sealant region 14 can also be used to place the wiring of the display panel 1.

As shown in FIGS. 2 and 3, the side adhesive region 15 is disposed on a side of the sealant region 14 away from the sub-pixel region 12 and is positioned in the sub-display region 102. That is, the side adhesive region 15 surrounds the frame glue region 14.

As shown in FIG. 2, the sub-display region 102 includes two first display regions 1021 and two second display regions 1022.

The two first display regions 1021 are parallel to each other and extend along a first direction X.

The two second display regions 1022 are parallel to each other and extend along the second direction Y. The second direction Y is perpendicular to the first direction X. In this embodiment, both the two second display regions 1022 are disposed between the two sub-display regions 1021.

Figure 4:
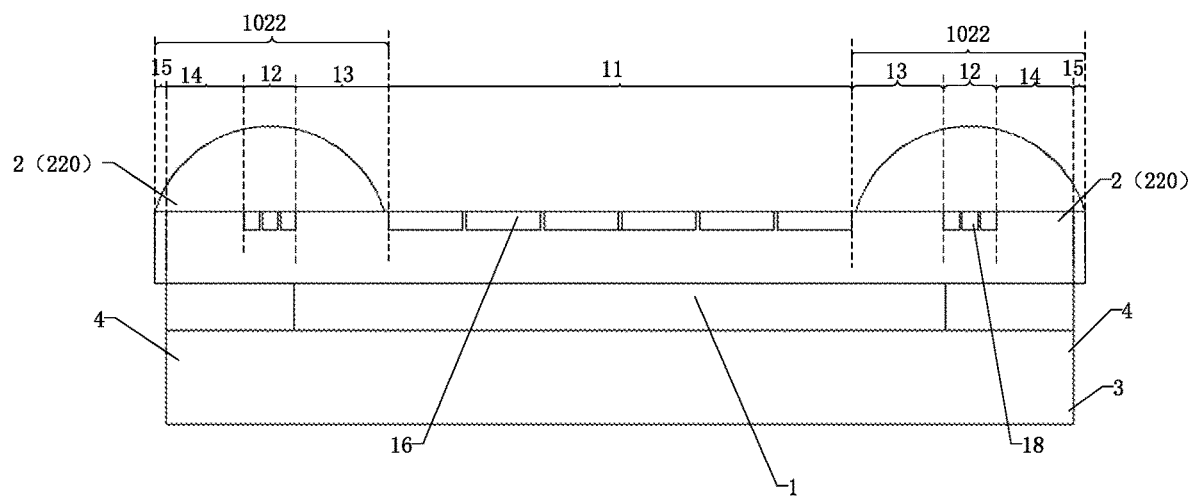
FIG. 4 is a cross-sectional view of B-B shown in FIG. 2.

As shown in FIGS. 2, 3 and 4, the display panel 1 includes a plurality of main-pixel units 16, a plurality of first sub-pixel units 17, and a plurality of second sub-pixel units 18.

A plurality of main-pixel units 16 are positioned in the main-pixel region 11 of the main-display region 101.

A plurality of first sub-pixel units 17 are positioned in at least one of the f first sub-display regions 1021.

A plurality of second sub-pixel units 18 are positioned in the second sub-display region 1022.

Figure 5:
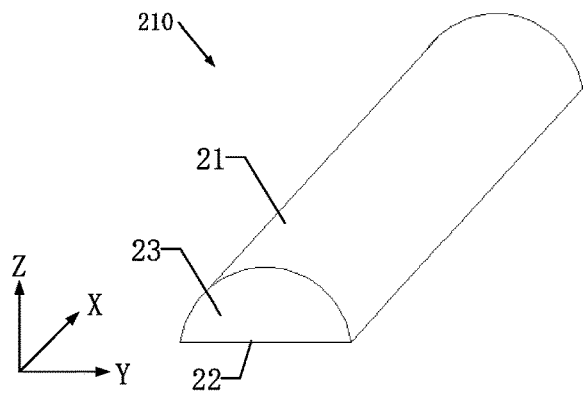
FIG. 5 is a schematic diagram of a structure of a first optical element.

As shown in FIGS. 3 to 5, the optical element 2 is disposed on the display panel 1 and covers the sub-display region 102. The optical element 2 is configured to amplify a light exit angle of the light emitted, reflected or transmitted by the display panel 1 of the sub-display region 102.

By setting the sub-pixel region 12 in the sub-display region 102 (a frame region not shown in the prior art) on a periphery of the main-display region 101, and by disposing the optical element 2 on the sub-pixel region 12. The optical element 2 is configured to amplify the light exit angle of the light emitted, reflected or transmitted by the display panel 1 of the sub-display region 102. A frame region becomes the sub-display region 102 with the same display effect as the main-display region 101, thereby realizing a true borderless display effect.

As shown in FIGS. 3 to 5, in this embodiment, the optical element 2 is a plano-convex lens, a side of a top surface 21 far away from the display panel 1 of the optical element 2 is a curved surface, and a side of a bottom surface close to the display panel 1 of the optical element 2 is a flat surface. The optical element 2 also includes two terminal surfaces 23 vertically connected between the bottom surface 22 and the top surface 21. On a cross-section parallel to the terminal surface 23 of the optical element 2, the optical element 2 amplifies the light exit angle of the light emitted, reflected or transmitted by the display panel 1 of the sub-display region 102.

The optical element 2 completely covers the wiring region 13, the sub-pixel region 12, the sealant region 14, and the side adhesive region 15. That is, the optical element 2 completely covers the sub-display region 12, and seamless display can be realized when a plurality of display devices 100 are splice to form a splice display device 200.

As shown in FIGS. 3 to 8, the optical element 2 includes a first optical element 210 and a second optical element 220.

As shown in FIGS. 2, 3, 5, and 6, the first optical element 210 covers the first sub-display region 1021 and extends along the first direction X. A central axis of the first optical element 210 parallel to the first direction X coincides with a central axis of the sub-pixel region 12 of the first sub-display region 1021 parallel to the first direction X. A terminal surface 23 of the first optical element 210 is perpendicular to the first direction X. That is, in this embodiment, on a cross section (ZY plane) parallel to the terminal surface 23 of the first optical element 210, the first optical element 210 amplifies a light exit angle of the light transmitted by first sub-pixel unit 17 of the first sub-display region 1021. In other embodiments, on a cross-section (ZY plane) parallel to the terminal surface 23 of the first optical element 210, the first optical element 210 can be configured to amplify a light exit angle of the ambient light reflected by the pixel unit 17 of the first sub-display region 1021. On a cross-section (ZY plane) parallel to the terminal surface 23 of the first optical element 210, the first optical element 210 can amplify the light exit angle of the light emitted by the first sub-pixel unit 17 of the first sub-display region 1021 when the first sub-pixel unit 17 is an OLED, a Mini LED or a Micro LED.

As shown in FIGS. 2, 3, 7, and 8, the second optical element 220 covers the second sub-display region 1022 and extends along the second direction Y. A central axis of the second optical element 220 parallel to the second direction Y coincides with A central axis of the sub-pixel region 12 of the second sub-display region 1022 parallel to the second direction Y. A terminal surface of the second optical element 220 is perpendicular to the second direction Y. That is, in this embodiment, on a cross-section (ZX plane) parallel to the terminal surface 23 of the second optical element 220, the second optical element 220 amplifies a light exit angle of the light transmitted by the second sub-pixel unit 18 of the second sub-display region 1022. In other embodiments, on a cross-section (ZX plane) parallel to the terminal surface 23 of the second optical element 220, the first optical element 210 can be configured to amplify the light exit angle of the ambient light reflected by the first sub-pixel unit 17 of the first sub-display region 1021. On the cross-section (ZX plane) parallel to the terminal surface 23 of the second optical element 220, the first optical element 210 can amplify the light exit angle of the light emitted by the first sub-pixel unit 17 of the first sub-display region 1021 when the first sub-pixel unit 17 is an OLED, a Mini LED or a Micro LED.

Figure 6:
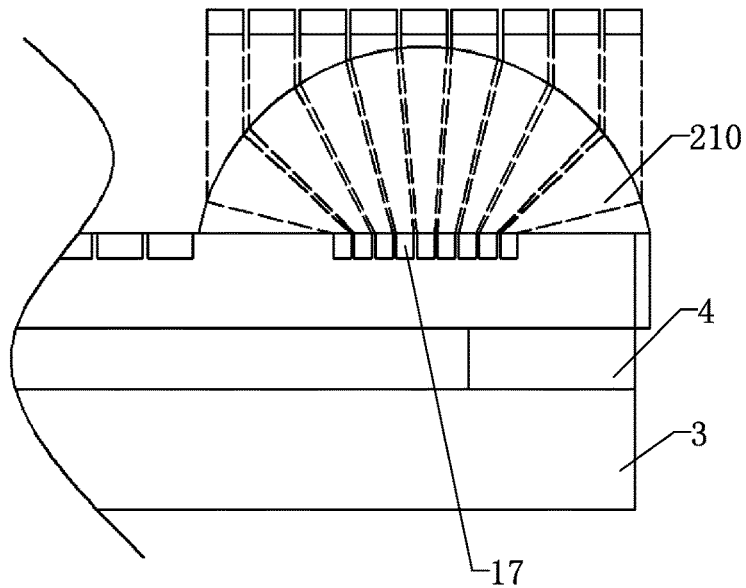
FIG. 6 is a schematic diagram of a display effect of the light of a first pixel unit after being amplified by the first optical element.
Figure 7:
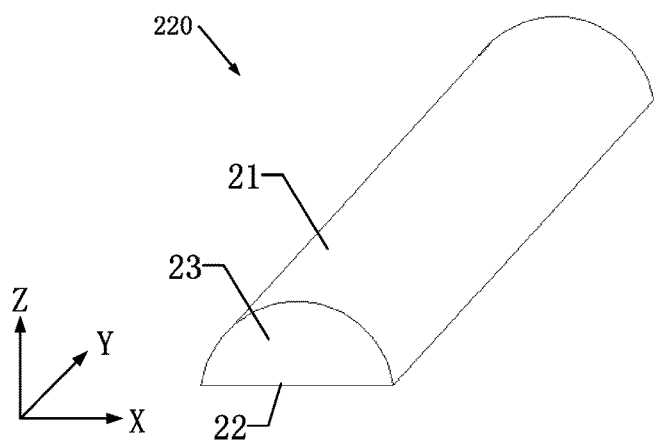
FIG. 7 is a schematic diagram of a structure of a second optical element.

As shown in FIGS. 2, 3, and 6, a length of the first sub-pixel unit 17 in the first direction X is the same as a length of the main-pixel unit 16 in the first direction X. A length of the first sub-pixel unit 17 in the second direction Y is shorter than a length of the main-pixel unit 16 in the second direction Y. The first optical element 210 is configured to amplify the light exit angle of the first sub-pixel unit 17 on the ZY plane of the first sub-display region 1021, so that an enlarged display length of the first sub-pixel unit 17 in the first direction X is equal to the display length of the main-pixel unit 16 in the first direction X. An enlarged display length of the first sub-pixel unit 17 in the second direction Y is equal to the display length of the main-pixel unit 16 in the second direction Y, to achieve a purpose as a same display effect of the first sub-display region 1021 and the main-display region 101.

Figure 8:
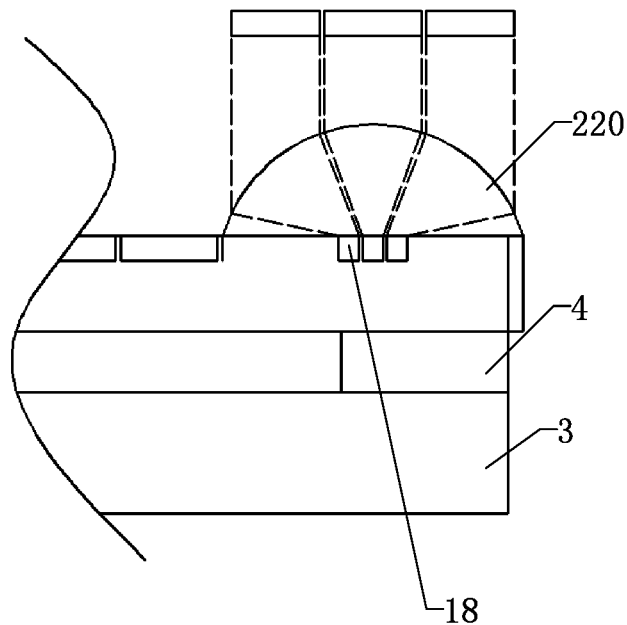
FIG. 8 is a schematic diagram of the display effect of the light of a second pixel unit after being amplified by the second optical element.

As shown in FIGS. 2, 4, and 8, a length of the second sub-pixel unit 18 in the second direction Y is the same as a length of the main-pixel unit 16 in the second direction Y. A length of the second sub-pixel unit 18 in the first direction X is shorter than the length of the main-pixel unit 16 in the first direction X. The second optical element 220 amplifes the light exit angle of the second sub-pixel unit 18 of the second sub-display region 1022 on the ZX plane, to make an enlarged display length of the second sub-pixel unit 18 in the second direction Y is equal to a display length of the main-pixel unit 16 in the second direction Y. An enlarged display length of the second sub-pixel unit 18 in the first direction X is equal to a display length of the main-pixel unit 16 in the first direction X, to achieve a purpose as a same display effect of the second sub-display region 1022 and the main-display region 101.

The backlight source 3 is disposed on a side of the display panel 1 away from the optical element 2 and positioned in the main-display region 101 and the sub-display region 102.

Since the first sub-pixel unit 17 and the second sub-pixel unit 18 of the sub-pixel region 12 require the optical element 2 to amplify the light emitted by them, the optical element 2 causes attenuation of a brightness of the light emitted by the first sub-pixel unit 17 and the second sub-pixel unit 18. Moreover, the length of the first sub-pixel unit 17 in the second direction Y is shorter than the length of the main-pixel unit 16 in the second direction Y. The length of the second sub-pixel unit 18 in the first direction X is shorter than the length of the main-pixel unit 16 in the first direction X causes the light-emitting brightness of the sub-pixel region 12 to be darker than the light-emitting brightness of the main-pixel region 11. Therefore, the brightness of the backlight source 3 corresponding to the sub-pixel region 12 is greater than the brightness of the backlight source 3 corresponding to the main-pixel region 11. As a result, a display uniformity of the display device 100 is improved, and the display effect of the display device 100 is improved.

If the backlight source 3 adopts a direct type backlight source, the brightness of the backlight source 3 in the sub-pixel region 12 can be increased at this time. If the backlight source 3 adopts an edge-type backlight source, a reflection point of the light guide plate in the sub-pixel region can be increased, thereby increasing the brightness of the backlight source 3 in the sub-pixel region 12.

Embodiment 2

Figure 9:
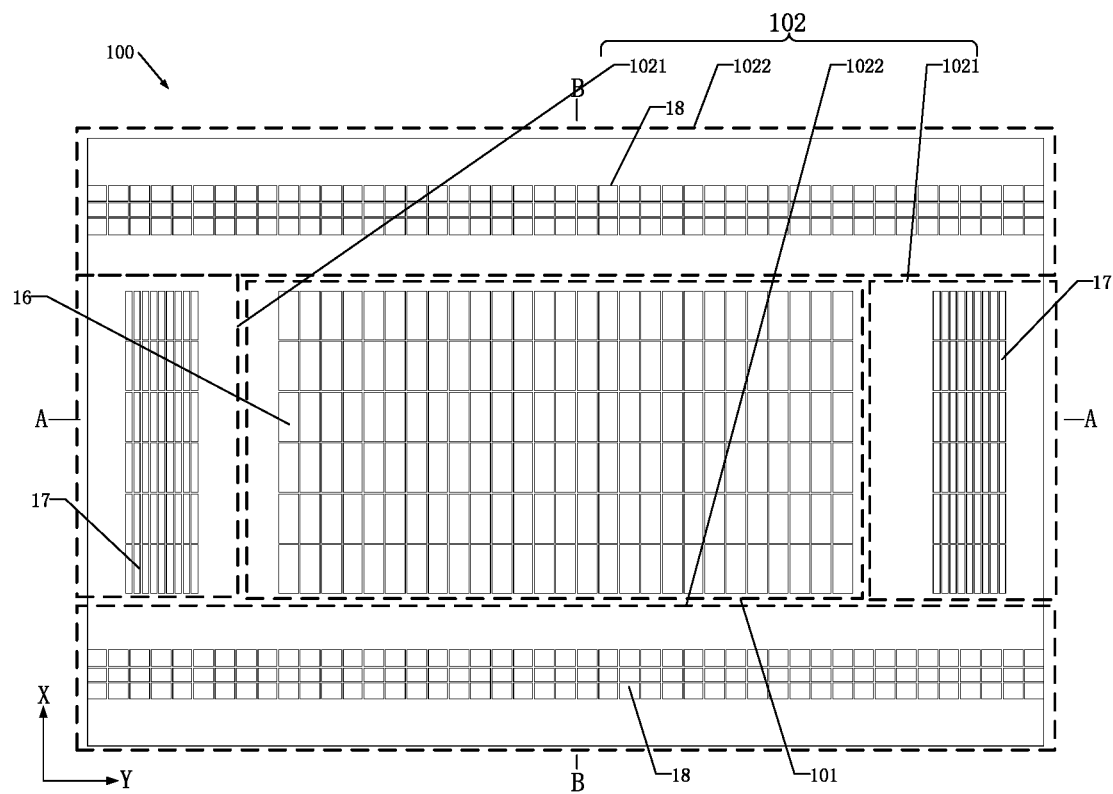
FIG. 9 is a schematic plan view of the display device of embodiment 2 of the present application.

As shown in FIG. 9, this embodiment includes most of the technical features of embodiment 1. A difference between this embodiment and embodiment 1 is that: in this embodiment, both of the two first sub-display regions 1021 are disposed between the two second sub-display regions 1022.

In this embodiment, the sub-pixel region 12 is provided in the sub-display region 102 (a frame region that is not displayed in the prior art) on a periphery of the main-display region 101, and the optical element 2 is provided on the sub-pixel region 12. The optical element 2 is used to amplify the light exit angle of the light emitted, reflected or transmitted by the display panel 1 of the sub-display region 102, to turn the frame region becomes the sub-display region 102 with a same display effect as the main display region 101, thereby realizing a true borderless display effect.

Embodiment 3

Figure 10:
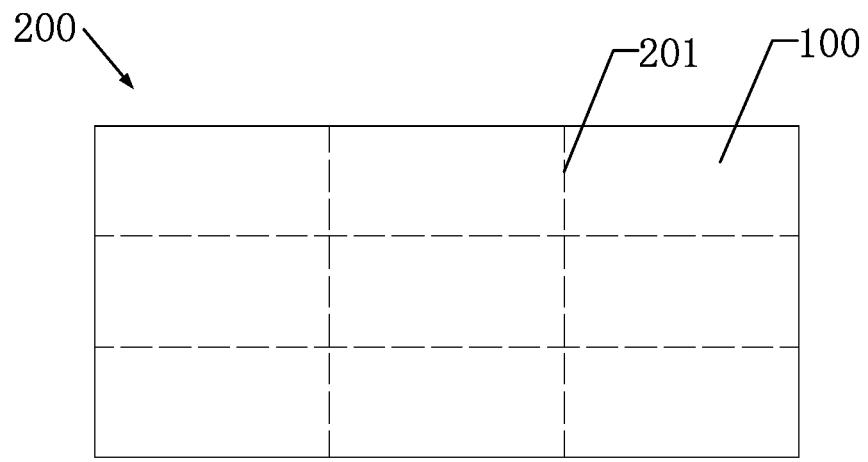
FIG. 10 is a schematic plan view of a splice display device of the present application.

As shown in FIG. 10, this embodiment provides a splice display device 200. The splice display device 200 includes a plurality of display devices 100 that are splice with each other. The display device 100 is the display device 100 of embodiment 1 or the display device 100 of embodiment 2.

Since the optical element 2 of the display device 100 completely covers the wiring region 13, the sub-pixel region 12, the sealant region 14, and the side adhesive region 15. That is, the optical element 2 completely covers the sub-display region 12, so that the display device 100 of Embodiment 1 and the display device 100 of Embodiment 2 are both borderless display devices, which can make the seam 201 of splicing of the splice display device 200 of this embodiment can be displayed normal, thereby improving the display effect of the splice display device 200, and enhancing a product competitiveness and an operating profit of the splice display device 200.

The above is a detailed introduction to a display device and a splice display device provided by the present application. Specific examples are used in this article to illustrate the principles and implementations of the present application. The description of the above embodiments is only used to help understand the method and core idea of the present application. At the same time, for those skilled in the art, according to the idea of the present application, there will be changes in a specific implementation and scope of the present application. In summary, a content of this specification should not be construed as a limitation of the present application.

What is claimed is:

1. A display device comprising a main-display region and a sub-display region surrounding the main-display region, wherein the display device comprises:
   a display panel comprising a main-pixel region positioned in the main-display region and arranged with a plurality of main-pixel units; and a sub-pixel region positioned in the sub-display region and arranged with a plurality of first sub-pixel units and a plurality of second sub-pixel units;
   the display panel further comprises:
      a wiring region disposed between the main-pixel region and the sub-pixel region and is positioned in the sub-display panel, wherein the wiring region is provided with a wiring of the display panel;
      a sealant region disposed on a side of the sub-pixel region away from the main-pixel region and positioned in the sub-display region; wherein the sealant region is provided with sealant of the display panel; and
      a side adhesive region disposed on a side of the sealant region away from the sub-pixel region and positioned in the sub-display region;
   wherein the optical element completely covers the wiring region, the sub-pixel region, the sealant region, and the side adhesive region; and
   an optical element disposed on the display panel and covers the sub-display region;
   wherein the optical element is configured to amplify a light exit angle of the light emitted, reflected or transmitted by the display panel of the sub-display region;
   wherein a central axis of the optical element along an extending direction thereof coincides with a central axis of the sub-pixel region along an extending direction thereof.

2. The display device according to claim 1, wherein the optical element is a plano-convex lens, and wherein a side of a bottom surface close to the display panel of the optical element is a flat surface, and wherein a side of a top surface far away from the display panel of the optical element is a curved surface.

3. The display device according to claim 2, wherein the optical element further comprises two terminal surfaces vertically connected between the bottom surface and the top surface;
   wherein on a cross-section parallel to the terminal surface of the optical element, the optical element amplifies the light exit angle of the light emitted, reflected or transmitted by the display panel of the sub-display region.

4. The display device according to claim 3, wherein the sub-display region comprises:
   two first sub-display regions parallel to each other, wherein the first sub-display regions extend along a first direction;
   the plurality of first sub-pixel units are positioned in at least one of the first sub-display regions;
   the optical element comprising:
   a first optical element covers the first sub-display region, wherein a terminal surface of the first optical element is perpendicular to the first direction.

5. The display device according to claim 4, wherein a length of the first sub-pixel unit in the first direction is the same as a length of the main-pixel unit in the first direction, and wherein a length of the first sub-pixel unit in the second direction perpendicular to the first direction is shorter than a length of the main-pixel unit in the second direction.

6. The display device according to claim 5, wherein the sub-display region further comprises:
   two second sub-display regions parallel to each other, wherein the sub-display regions extending in a second direction perpendicular to the first direction;
   the plurality of second sub-pixel units are positioned in at least one of the second sub-display regions;
   the optical element further comprising:

a second optical element covers at least one of the second sub-display region, wherein a terminal surface of the second optical element perpendicular to the second direction.

7. The display device according to claim 6, wherein a length of the second sub-pixel unit in the second direction is the same as a length of the main-pixel unit in the second direction, and wherein a length of the second sub-pixel unit in the first direction is shorter than a length of the main-pixel unit in the first direction.

8. The display device according to claim 7, wherein the two second sub-display regions are both disposed between the two first sub-display regions; or
both of the two first sub-display regions are disposed between both of the two second sub-display regions.

9. The display device according to claim 1, further comprising:
a backlight source disposed on a side of the display panel away from the optical element and positioned in the main-display region and the sub-display region; and
a fixing glue fixed between the display panel and the backlight;
wherein a brightness of the backlight source corresponding to the sub-pixel region is greater than a brightness of the backlight source corresponding to the main-pixel region.

10. A splice display device, comprising a plurality of display devices splice with each other;
the display device comprising a main-display region and a sub-display region surrounding the main-display region, wherein the display device comprises:
a display panel comprising a main-pixel region positioned in the main-display region and arranged with a plurality of main-pixel units; and a sub-pixel region positioned in the sub-display region and arranged with a plurality of first sub-pixel units and a plurality of second sub-pixel units;
the display panel further comprises:
a wiring region disposed between the main-pixel region and the sub-pixel region and is positioned in the sub-display panel, wherein the wiring region is provided with a wiring of the display panel;
a sealant region disposed on a side of the sub-pixel region away from the main-pixel region and positioned in the sub-display region; wherein the sealant region is provided with sealant of the display panel; and
a side adhesive region disposed on a side of the sealant region away from the sub-pixel region and positioned in the sub-display region;
wherein the optical element completely covers the wiring region, the sub-pixel region, the sealant region, and the side adhesive region; and
an optical element disposed on the display panel and covers the sub-display region;
wherein the optical element is configured to amplify a light exit angle of the light emitted, reflected or transmitted by the display panel of the sub-display region;
wherein a central axis of the optical element along an extending direction thereof coincides with a central axis of the sub-pixel region along an extending direction thereof.

11. The splice display device according to claim 10, wherein the optical element is a plano-convex lens, and wherein a side of a bottom surface close to the display panel of the optical element is a flat surface, and wherein a side of a top surface far away from the display panel of the optical element is a curved surface.

12. The splice display device according to claim 11, wherein the optical element further comprises two terminal surfaces vertically connected between the bottom surface and the top surface;
wherein on a cross-section parallel to the terminal surface of the optical element, the optical element amplifies the light exit angle of the light emitted, reflected or transmitted by the display panel of the sub-display region.

13. The splice display device according to claim 12, wherein the sub-display region comprises:
two first sub-display regions parallel to each other, wherein the first sub-display regions extend along a first direction;
the plurality of first sub-pixel units are positioned in at least one of the first sub-display regions;
the optical element comprising:
a first optical element covers the first sub-display region, wherein a terminal surface of the first optical element is perpendicular to the first direction.

14. The splice display device according to claim 13, wherein a length of the first sub-pixel unit in the first direction is the same as a length of the main-pixel unit in the first direction, and wherein a length of the first sub-pixel unit in the second direction perpendicular to the first direction is shorter than a length of the main-pixel unit in the second direction.

15. The splice display device according to claim 14, wherein the sub-display region further comprises:
two second sub-display regions parallel to each other, wherein the sub-display regions extending in a second direction perpendicular to the first direction;
the plurality of second sub-pixel units are positioned in at least one of the second sub-display regions;
the optical element further comprising:
a second optical element covers at least one of the second sub-display region, wherein a terminal surface of the second optical element perpendicular to the second direction.

16. The splice display device according to claim 15, wherein a length of the second sub-pixel unit in the second direction is the same as a length of the main-pixel unit in the second direction, and wherein a length of the second sub-pixel unit in the first direction is shorter than a length of the main-pixel unit in the first direction.

17. The splice display device according to claim 16, wherein the two second sub-display regions are both disposed between the two first sub-display regions; or
both of the two first sub-display regions are disposed between both of the two second sub-display regions.

18. The splice display device according to claim 10, further comprising:
a backlight source disposed on a side of the display panel away from the optical element and positioned in the main-display region and the sub-display region; and
a fixing glue fixed between the display panel and the backlight;
wherein a brightness of the backlight source corresponding to the sub-pixel region is greater than a brightness of the backlight source corresponding to the main-pixel region.

* * * * *